(12) United States Patent
Rangarajan et al.

(10) Patent No.: US 7,052,575 B1
(45) Date of Patent: May 30, 2006

(54) SYSTEM AND METHOD FOR ACTIVE CONTROL OF ETCH PROCESS

(75) Inventors: Bharath Rangarajan, Santa Clara, CA (US); Bhanwar Singh, Morgan Hill, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 675 days.

(21) Appl. No.: 09/845,454

(22) Filed: Apr. 30, 2001

(51) Int. Cl.
*C23F 1/00* (2006.01)

(52) U.S. Cl. .................. 156/345.13; 156/345.15; 156/345.22; 156/345.24; 156/345.35

(58) Field of Classification Search .......... 156/345.13, 156/345.15, 345.22, 345.24, 345.35
See application file for complete search history.

(56) References Cited

U.S. PATENT DOCUMENTS

| | | | |
|---|---|---|---|
| 5,711,843 A | * | 1/1998 | Jahns .................... 156/345.24 |
| 6,113,733 A | * | 9/2000 | Eriguchi et al. ....... 156/345.24 |
| 6,117,791 A | * | 9/2000 | Ko et al. ..................... 438/723 |
| 6,483,580 B1 | * | 11/2002 | Xu et al. ..................... 356/300 |
| 6,486,492 B1 | * | 11/2002 | Su ............................... 257/48 |

* cited by examiner

*Primary Examiner*—Duy-Vu N. Deo
*Assistant Examiner*—Binh X. Tran
(74) *Attorney, Agent, or Firm*—Amin & Turocy, LLP

(57) ABSTRACT

A system for regulating an etch process is provided. The system includes one or more light sources, each light source directing light to one or more features and/or gratings on a wafer. Light reflected from the features and/or gratings is collected by a measuring system, which processes the collected light. The collected light is indicative of the dimensions achieved at respective portions of the wafer. The measuring system provides etching related data to a processor that determines the acceptability of the etching of the respective portions of the wafer. The system also includes one or more etching devices, each such device corresponding to a portion of the wafer and providing for the etching thereof. The processor selectively controls the etching devices to regulate etching of the portions of the wafer.

12 Claims, 15 Drawing Sheets

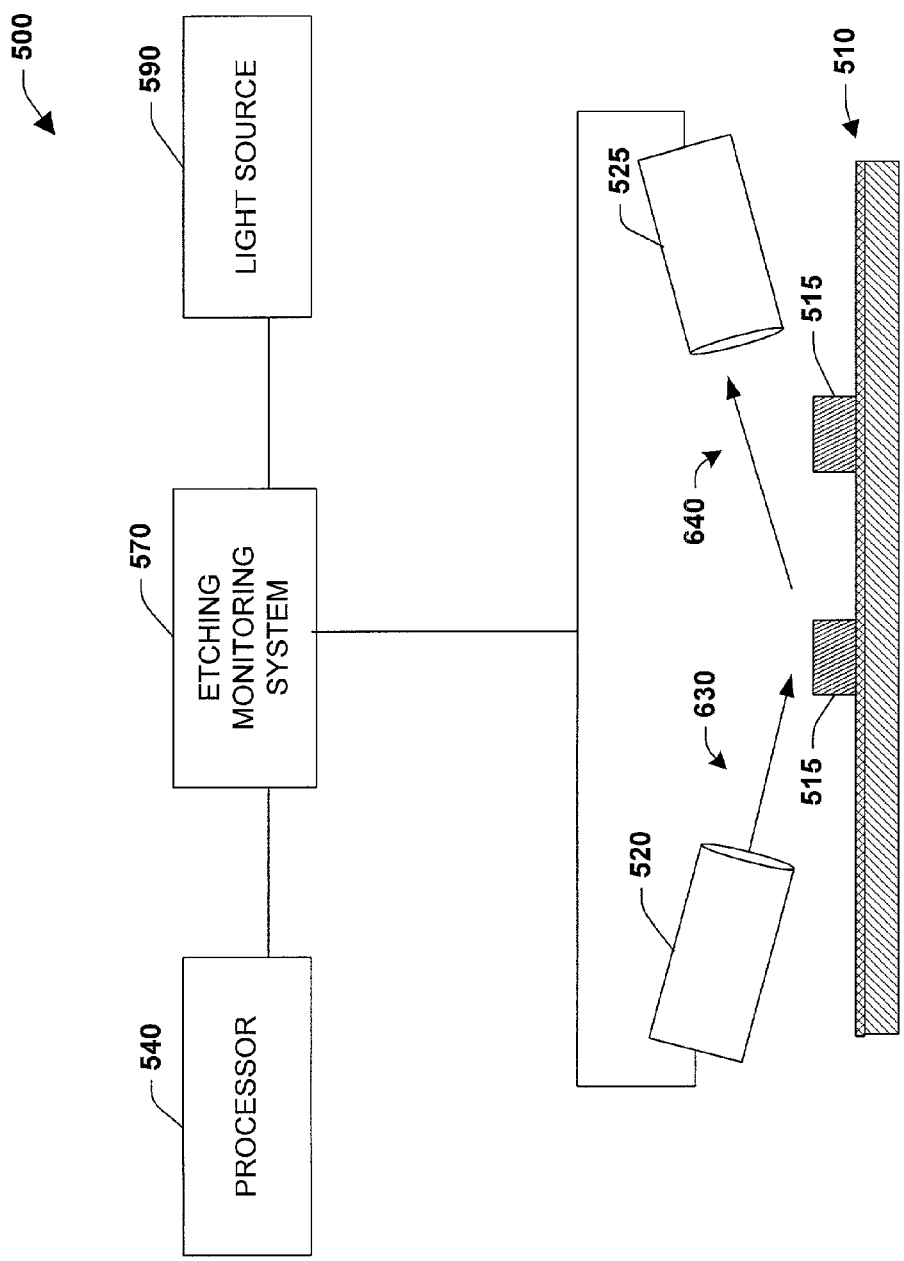

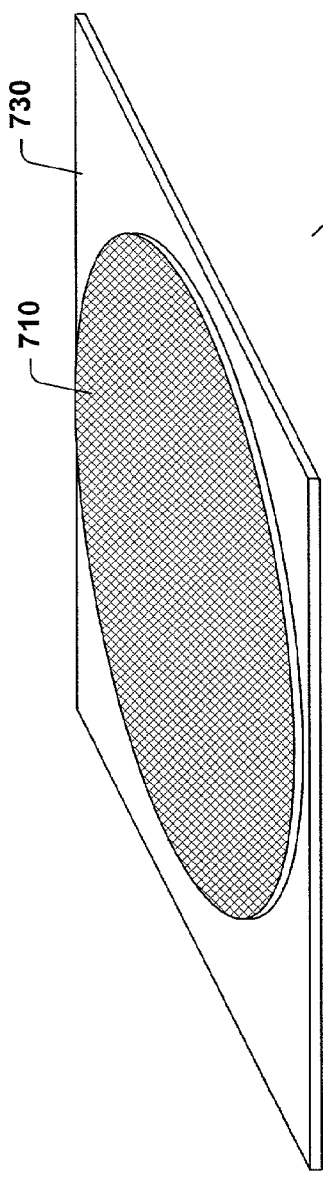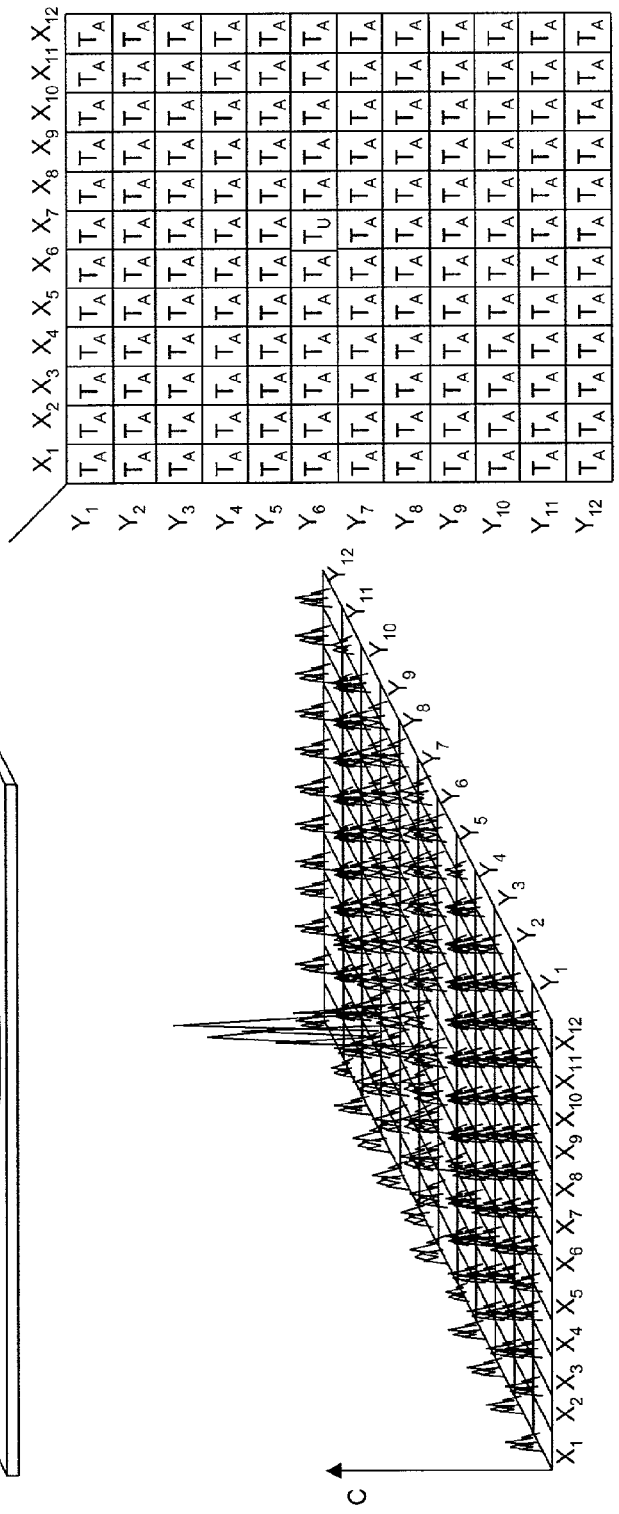

SYSTEM AND METHOD FOR ACTIVE CONTROL OF ETCH PROCESS

TECHNICAL FIELD

The present invention generally relates to semiconductor processing, and in particular to a system and method for monitoring and controlling an etch process using real-time feed forward control based on scatterometry analysis.

BACKGROUND

In the semiconductor industry, there is a continuing trend toward higher device densities. To achieve these high densities there have been, and continue to be, efforts toward scaling down device dimensions (e.g., at sub-micron levels) on semiconductor wafers. In order to accomplish such high device packing densities, smaller and smaller features sizes are required. This may include the width and spacing of interconnecting lines, spacing and diameter of contact holes, and the surface geometry, such as corners and edges, of various features. The dimensions of and between such small features can be referred to as critical dimensions (CDs). Reducing CDs, and reproducing more accurate CDs facilitates achieving such higher device densities. Conventional etch processes have either lacked feedback control systems, requiring pre-calculated etching steps, or have had indirect feedback control, which is based on indirect information (e.g., amount of gas generated by plasma gas discharge etching) or have required sacrificing valuable wafer space. Such pre-determined calculations and/or indirect feedback control do not provide adequate monitoring and thus do not facilitate precise control over the etch process. Another conventional form of etch control is performed by reproducing etch times. But such time based control does not account for wafer to wafer variations and does not account for wafers with various feature densities. Monitoring tools employed in conjunction with metrology based feed-forward information are known in the art and provide improvements over time based control. But such metrology feed-forward systems can be improved by more accurate monitoring, better CD recognition and more precise feed-forward information.

The process of manufacturing semiconductors, or integrated circuits (commonly called ICs, or chips), typically consists of more than a hundred steps, during which hundreds of copies of an integrated circuit may be formed on a single wafer. Each step can affect the CDs of the ICs. Generally, the manufacturing process involves creating several patterned layers on and into the substrate that ultimately forms the complete integrated circuit. This layering process creates electrically active regions in and on the semiconductor wafer surface. The size, shape and isolation of such electrically active regions, and thus the reliability and performance of integrated circuits employing such regions thus depend, at least in part, on the precision with which etching can be performed.

Unfortunately, commonly used fabrication systems check devices for CDs near or at the end of fabrication, or at pre-scheduled time intervals. These types of endpoint and interval detection methods can be problematic for several reasons. For example, at late stages in the fabrication process, the presence of at least one malformed portion of a device may render the whole semiconductor device unusable, forcing it to be discarded. In addition, post-fabrication detection/quality control data do not provide a user with real-time information related to the device being fabricated. Post-fabrication data may only allow an estimation or a projection as to what adjustments are needed to correct the fabrication errors and/or flaws. Such estimations and/or projections concerning necessary adjustments may lead to continued or recurring fabrication errors. Moreover, such a lengthy adjustment process may cause subsequent fabricated wafers to be wasted in the hopes of mitigating etch process errors.

Visual inspection methods have been important in both production and development of integrated circuits. Visually inspecting developed photoresist patterns from a dose-focus matrix is well-known in the art. While visual inspection techniques may be simple to implement, they are difficult to automate. Further, visual techniques employing scanning electron microscopes (SEM) and atomic force microscopes (AFM) can be expensive, time-consuming and/or destructive.

Due to the extremely fine patterns that are exposed on the photo resist, controlling the etching process, whereby oxide and/or other conductive or insulating layers are removed, is a significant factor in achieving desired critical dimensions. Achieving greater precision in etch processes can result, for example, in achieving more precise CDs (e.g., desired lengths and widths between layers, between features and within features). Thus, an efficient system, and/or method, to monitor and control etch processes is desired to facilitate manufacturing ICs exhibiting desired critical dimensions.

SUMMARY OF THE INVENTION

The following presents a simplified summary of the invention in order to provide a basic understanding of some aspects of the invention. This summary is not an extensive overview of the invention. It is not intended to identify key or critical elements of the invention or to delineate the scope of the invention. Its sole purpose is to present some concepts of the invention in a simplified form as a prelude to the more detailed description that is presented later.

The present invention provides a system that facilitates controlling etching processes involved in semiconductor manufacturing. An exemplary system can employ one or more light sources arranged to project light onto one or more features and/or gratings on a wafer, and one or more light sensing devices (e.g., photo detector, photodiode) for detecting light reflected and/or refracted by the one or more features and/or gratings. A grating is usually divided into a large number of sufficiently thin planar grating slabs to approximate an arbitrary profile. The light reflected from the one or more features and/or gratings is indicative of at least one parameter of etching processes (e.g., percent completion of etching) that can be measured to determine whether desired critical dimensions (CDs) have been achieved and to determine whether adaptations to one or more etching processes should be undertaken.

One or more etching components can be arranged to correspond to a particular wafer portion. Alternatively, one or more etching components can be employed to etch various wafer portions. The etching components may be, for example, a gas plasma apparatus employed in reactive ion etching. It is to be appreciated that any suitable etching components may be employed with the present invention. For example, components employed in performing a main etch, or during a trim etch (e.g., etch step before main etch (e.g., descum etch), PR (photoresist) trim, BARC (breakthrough antireflective coating)) may be employed in accordance with the present invention. The etching components are selectively driven by the system to etch away oxide and/or other materials at a desired location, at a desired rate, to a desired depth and/or to a desired width. The etching progress is monitored by the system by comparing the critical dimensions (e.g., space between features and/or gratings, depth and/or height of the features and/or gratings) on the wafer to desired critical dimensions. Data gathered during such monitoring can be analyzed to determine whether adaptations to the etch process are desired. As a result, more optimal etching is achieved by controlling the etching components that are etching the portions of the wafer, which in turn increases IC quality. Additionally, and/or alternatively, data concerning etch process conditions that resulted in favorable and/or unfavorable CDs can be stored to facilitate reproducing favorable etch process conditions for subsequent portions of the wafer being etched and/or for subsequent wafers.

One aspect of the present invention provides a system for monitoring and regulating an etch process. The system includes an etching component that can etch at least one portion of a wafer and an etch component driving system for driving the etching component. The system includes fabricating gratings on the wafer and a system for directing light toward gratings located on the wafer. The system further includes an etch monitoring system operable to measure etching parameters from light reflected from the gratings and a processor operatively coupled to the etch monitoring system and the etch component driving system. The processor receives etching parameter data from the measuring system and analyzes the etching parameter data by comparing the measured etching parameter data to stored etching parameter data to generate a feed-forward control data operative to control the etching component.

Another aspect of the present invention provides a method for monitoring and regulating an etch process. The method includes logically partitioning a wafer into one or more portions. The method then establishes one or more gratings to be etched on the wafer and directs an incident light onto the gratings and collects light reflected from the grating. The reflected light is measured to determine one or more critical dimensions associated with the grating. The method includes computing adjustments for etching components by comparing scatterometry signatures associated with the measured critical dimensions to scatterometry signatures associated with stored critical dimensions and employing the adjustments to adjust the etch process.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention may become apparent from the following detailed description of the invention when considered in conjunction with the drawings.

BRIEF DESCRIPTION OF THE DRAWINGS

FIG. 6 is a partial schematic block diagram of the system of FIG. 5 being employed in connection with determining etching progress by measuring grating CDs in accordance with an aspect of present invention.

FIG. 7 is a perspective illustration of a substrate (including photo resist) that may be etched in accordance with an aspect of the present invention.

FIG. 8 is a representative three-dimensional grid map of a wafer illustrating CD measurements taken in accordance with an aspect of the present invention.

FIG. 9 is an etching measurement table correlating the CD measurements of FIG. 8 with desired values for the CDs in accordance with the present invention.

DETAILED DESCRIPTION OF THE INVENTION

Figure 1:
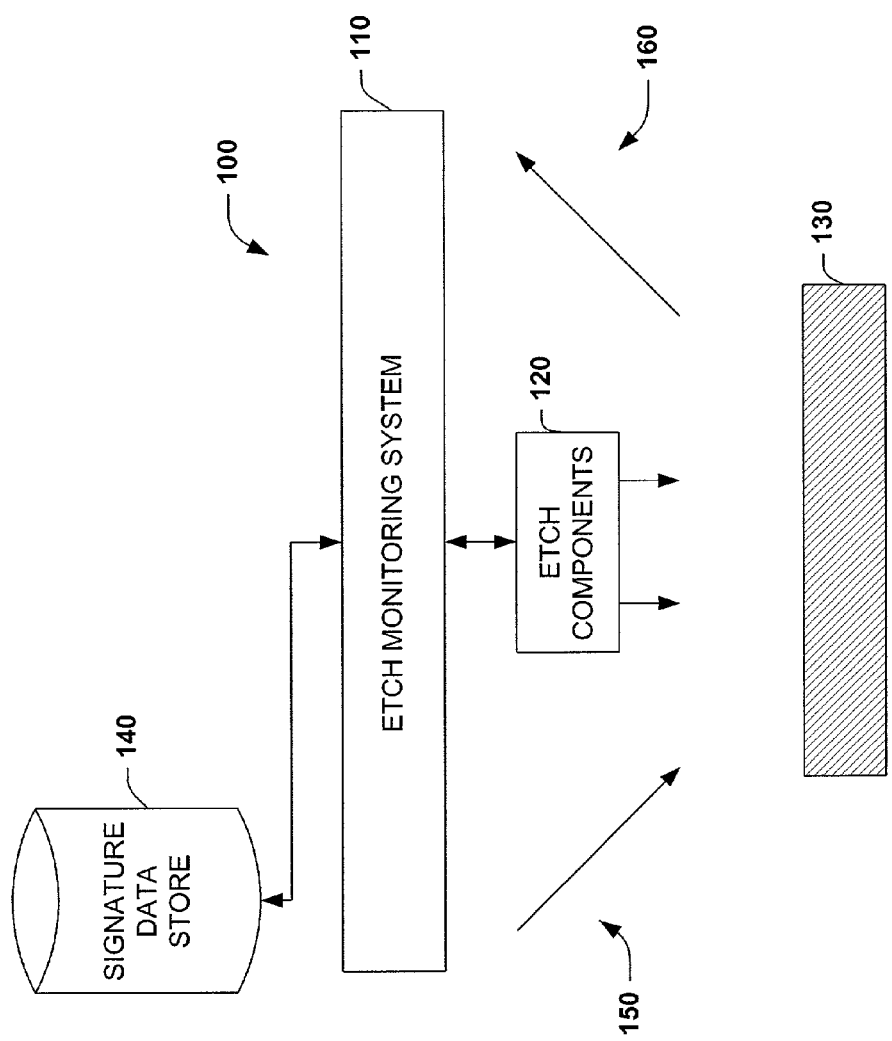
FIG. 1 is a schematic block diagram of a system for monitoring and controlling an etch process in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, to one skilled in the art that the present invention may be practiced without these specific details. In other instances, well-known structures and devices are shown in block diagram form in order to facilitate describing the present invention.

The term "component" refers to a computer-related entity, either hardware, a combination of hardware and software, software, or software in execution. For example, a component may be a process running on a processor, a processor, an object, an executable, a thread of execution, a program and a computer. By way of illustration, both an application running on a server and the server can be components. By way of further illustration, both an ion gun and a process controlling an ion gun can be components.

It is to be appreciated that various aspects of the present invention may employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks and function link networks) may be employed.

Referring initially to FIG. 1, a system 100 for monitoring and controlling an etch process is illustrated. Such etch processes may be employed, for example, to remove hardened photoresist. While the illustrations associated with this application primarily depict etching occurring directly under one or more etch components, it is to be appreciated that directional etches may also be monitored and/or controlled by the present invention. In plasma etching systems, specific gases are fed into the reaction chamber. There, the plasma creates reactive species from those gases. The etch rate is generally proportional to the concentration of the reactive species. Thus, conventional techniques may employ indirect measurements, including analyzing the reacted gases, to determine etching progress. But such techniques do not provide direct information concerning CDs being achieved on a wafer 130.

The system 100 includes an etch monitoring system 110 operative to direct a light 150 at a wafer 130 that is going to be etched or that is in the process of being etched. The etch monitoring system 110 can be a standalone device and/or can also be distributed between two or more cooperating devices and/or processes. The etch monitoring system 110 can reside in one physical or logical device (e.g., computer, process) and/or be distributed between two or more physical or logical devices. The etch monitoring system 110 may include one or more components that are located inside a process chamber and/or one or more components that are not located inside a process chamber. The etch components 120 may be employed, for example, in dry-etching techniques where the mechanism of etching has a physical basis (e.g., glow-discharge sputtering, ion-milling), a chemical basis (e.g., plasma etching), and a combination of bases (e.g., reactive ion etching (RIE), ion-enhanced etching).

The light 150 may be generated by many different light sources, and in one example aspect of the present invention the light 150 is generated by a frequency-stabilized laser. The etch monitoring system may direct the light 150 at substantially all of the wafer 130 and/or at selected portions of the wafer. By way of illustration, in one example aspect of the present invention, the light 150 may be directed at selected portions of the wafer 130, where such portions provide data sufficient to generate scatterometry signatures. A light 160 reflected from the wafer 130 is collected by the etch monitoring system 1110, which may then employ scatterometry techniques to analyze the reflected light 160 to determine one or more etch parameters associated with etching the wafer 130. For example, the width of lines may be analyzed to determine whether acceptable critical dimensions have been achieved. Other parameters including, but not limited to horizontal etch rate, vertical etch rate, etch-rate percent uniformity and isotropic versus anisotropic effects may also be analyzed.

It is to be appreciated that the surface of the wafer 130, including features, can both reflect and refract the light 150, so that the light 160 can be a complex reflected and/or refracted light. The scatterometry analysis can include comparing one or more scatterometry signatures associated with the reflected light 160 to one or more scatterometry signatures stored in a signature data store 140. Such signatures may be generated, for example, by combining phase and intensity information associated with the reflected light 160. As etching progresses, light reflecting from a wafer 130 may produce various signatures. The sequence in which such signatures are generated can be employed to determine the rate at which etching is progressing. For example, at a first point in time T1, light reflected from the wafer 130 may produce a signature S1 that indicates that lines with a first width W1 have been produced. Similarly, at a second point in time T2, light reflected from the wafer 130 may produce a signature S2 that indicates that lines with a second width W2 have been produced and at a third point in time T3, light reflected from the wafer 130 may produce a signature S3 that indicates that lines with a third width W3 have been produced. Analyzing the sequence of signatures, and the time required to produce transitions between such signatures can facilitate determining whether etching is progressing at an acceptable rate. Feedback information can be generated from such sequence analysis to maintain, increase and/or decrease the rate which etching progresses. For example, one or more reactive ion etching formulae can be altered to affect the etching rate based on the signature sequence analysis.

The signature data store 140 can store data in data structures including, but not limited to one or more lists, arrays, tables, databases, stacks, heaps, linked lists and data cubes. The signature data store 140 can reside on one physical device and/or may be distributed between two or more physical devices (e.g., disk drives, tape drives, memory units). Analyses associated with the reflected light 160 and/or the signatures stored in the signature data store 140 can be employed to control one or more etching components 120. It is to be appreciated that the etching components 120 can include, but are not limited to, etching components associated with descum etch steps performed before a main etch, PR trim etch steps, BARC (breakthrough anti-reflective coating) etch steps and main etch steps. It is to be further appreciated that the etching components 120 can be employed to remove exposed regions of a positive photoresist mask and/or unexposed regions of a negative photoresist mask using techniques like reactive ion etching, for example.

The precision with which resist portions are removed to create fine line patterns and the resulting precision in the distance between the remaining portions corresponds to the precision with which CDs are achieved. Therefore, the precision of the processing performed by the etch components 120 is directly related to the feature sizes and CDs that can be achieved on the wafer 130.

Figure 2:
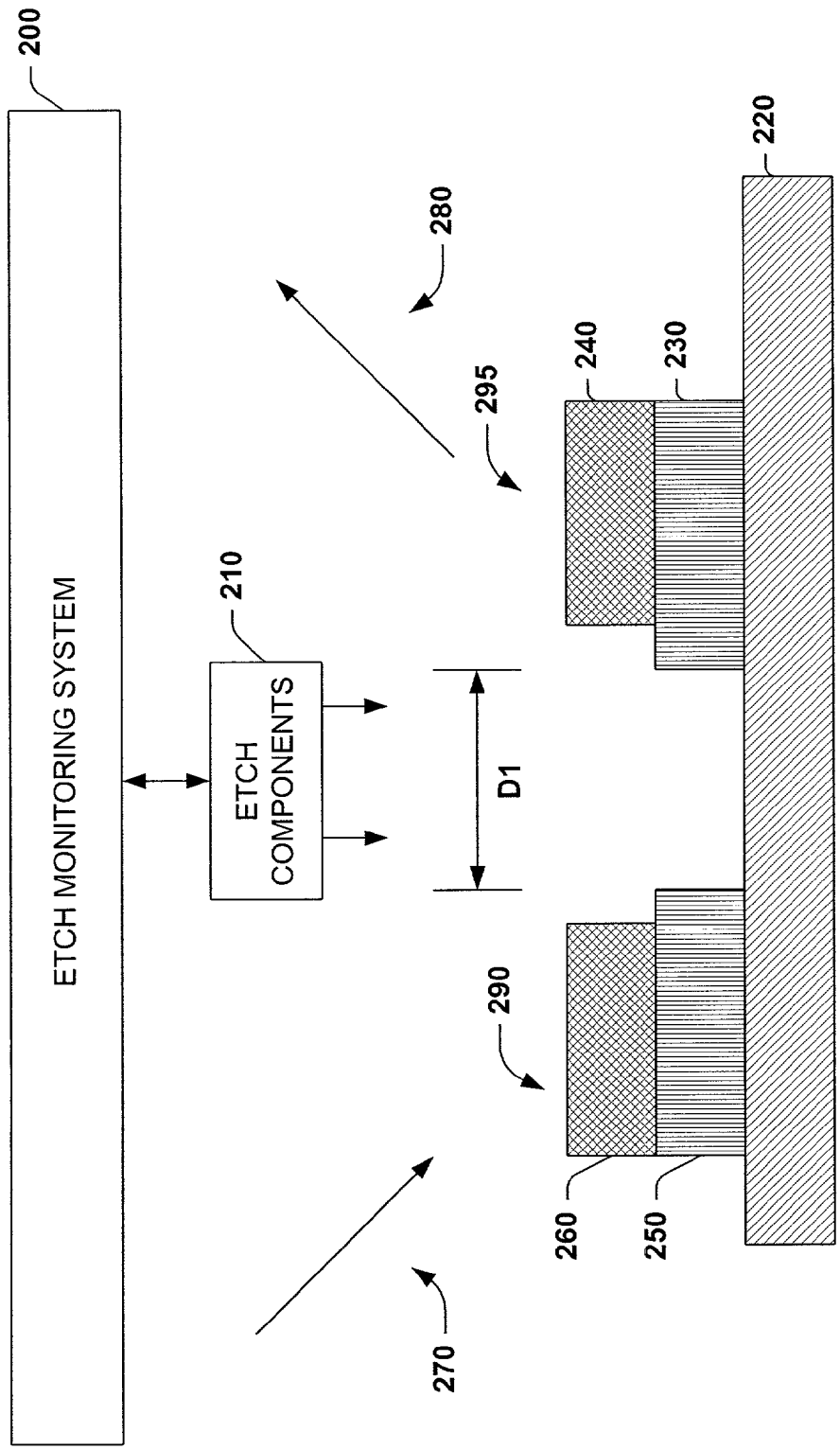
FIG. 2 is a cross-sectional view of a wafer being etched and monitored in accordance with an aspect of the present invention.

Turning now to FIG. 2, an etch monitoring system 200 is illustrated directing a light 270 at a wafer 220 and receiving back a reflected light 280. The etch monitoring system 200 can be a standalone device and/or can also be distributed between two or more cooperating devices and/or processes. The etch monitoring system 200 can reside in one physical or logical device (e.g., computer, process) and/or be distributed between two or more physical or logical devices. The etch monitoring system 200 may include one or more components that are located inside a process chamber and/or one or more components that are not located inside a process chamber.

The reflected light 280 will be affected by parameters including, but not limited to the chemical properties of the wafer 220 and/or the layers on the wafer 220, the size, shape and location of features on the wafer 220, the size, shape and location of gratings on the wafer 220 and the size, shape and location of spaces between such features. By way of illustration, different materials that may be etched, (e.g. refractory metal silicides, polycides, aluminum, aluminum alloys, polysilicon, silicon nitride and silicon dioxide) may have different chemical properties that affect the reflected light 280. By way of further illustration, a gap D1 between a first feature 290 and a second feature 295 is illustrated. The first feature 290 is illustrated as having an oxide layer 250 substantially covered by a hardened photoresist layer 260. Similarly, the second feature 295 is illustrated as having an oxide layer 230 substantially covered by a hardened photoresist layer 240. One or more etching components 210 are illustrated operatively connected to the etch monitoring system 200. The etch components 210, which may be one or more of a variety of etch components known in the art can be employed to remove oxide that is not protected by the hardened resist layers 260 and 240. Thus, portions of the oxide layer 250 and 230 may be removed as a result of etch processes associated with the etch components 210.

The gap D1 and/or the geometry of the layers 230, 240, 250 and 260 and/or the relationships between the geometry of the layers 230, 240, 250 and 260 can be measured by the etch monitoring system 200 to determine whether desired CDs have been achieved on the wafer 220. For example, a signature associated with the gap D1 and the geometry of the layers 230, 240, 250 and 260 may indicate that further etching of the layers 230 and 250 by the etching components 210 may be required. Thus, information operable to control the etch components 210 may be generated by the etch monitoring system.

As etching of the wafer 220 progresses, light reflecting from the wafer 220 mid/or the features 290 and 295 may produce various signatures. The sequence in which such signatures are generated can be employed to determine the rate at which etching is progressing. Similarly, the sequence of such signatures may be employed to determine the rate at which the gap D1 is changing. Such changes in rates can be employed to determine completion times, for example, and thus can be employed to facilitate scheduling subsequent etch processes.

By way of illustration, at a first point in time T5, light reflected from the wafer 220 and/or the features 290 and 295 may produce a signature S5 that indicates that the gap D1 has reached a first measurement. Similarly, at a second point in time T6, light reflected from the wafer 220 and/or the features 290 and 295 may produce a signature S6 that indicates that the gap D1 has reached a second measurement and at a third point in time T7, light reflected from the wafer 220 may produce a signature S6 that indicates that the gap D1 has reached a third desired measurement, and that etching should conclude. Analyzing the sequence of signatures, and the time required to produce transitions between such signatures can facilitate determining whether etching is progressing at an acceptable rate. Feedback information can be generated from such sequence analysis to maintain, increase and/or decrease the rate which etching progresses. For example, the direction of one or more directional etch processes can be altered to affect the etching location and/or rate based on the signature sequence analysis.

Figure 3:
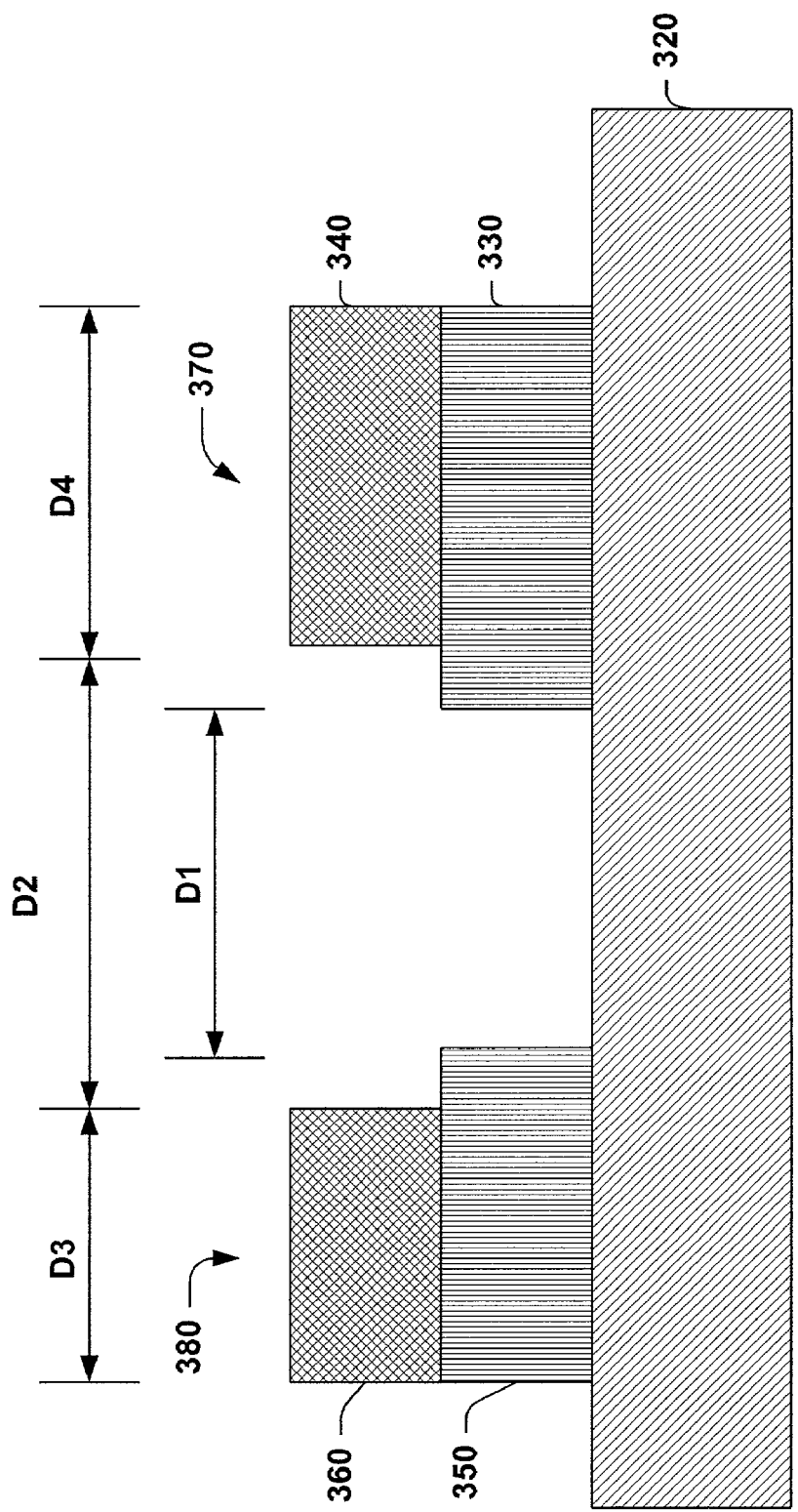
FIG. 3 is a cross-sectional view of a wafer being monitored for CDs in accordance with an aspect of the present invention.

Turning now to FIG. 3, measurements that may affect signatures generated by a scatterometry system associated with controlling one or more etch processes to facilitate achieving desired critical dimensions are illustrated. Controlling such measurements (e.g., gate width and thickness, linewidth and thickness) can be important to reliable and efficient operation of an integrated circuit. For example, both gate delay and drive current are proportional to the inverse of the gate length. Thus, gate lengths should be tightly controlled across chips and wafers to facilitate correlating and sequencing signals. A wafer 320 is illustrated with two features 370 and 380. The feature 370 is illustrated with an oxide layer 330 and a hardened photoresist layer 340. Similarly, the feature 380 is illustrated with an oxide layer 350 and a hardened photoresist layer 360. While the oxide layers 350 and 330 are separated by a distance D1, this distance may, for example, be too small for reliable operation of the integrated circuit being fabricated on the wafer 320 or to allow for the creation of a subsequent intervening feature in the gap measured by D1.

A desired critical dimension for the distance between the oxide layer 250 and the oxide layer 330 may be the distance D2. For example, a gap of size D2 may be required to facilitate fabricating a subsequent feature that will reside between the features 370 and 380. Lithography sufficient to harden the photoresist layer 360 and the photoresist layer 370 may have been achieved in earlier fabrication steps, but such precise lithography may go to waste if precise etching of the features 370 and 380 can not be achieved. For example, sophisticated lithography may have produced the hardened photoresist 360 with a desired width of D3. Similarly, sophisticated lithography may have produced the hardened photoresist layer 340 with have a desired width of D4, which should suffice to facilitate etching the oxide layers 350 and 330 if precise etching control is possible. But if precise etching control is not possible, then the distance D1 may be maintained, and reliable operation may not be achieved and/or the intervening feature may not be able to be created.

Thus, the present invention facilitates generating information concerning such distances D1, D2, D3 and D4 and the resulting topographies of resist and oxide layers. Such information, generated, at least in part, in response to in situ reflected light being analyzed by scatterometry techniques can be employed to provide real-time feed-forward information that can be employed to control etch processes so that desired critical dimensions can be achieved, thus providing advantages over conventional systems. For example, one or more signatures associated with the wafer 320 and/or the features 370 and 380 can be generated. At a first point in time T10, a signature S10 may be generated that indicates that desired critical dimensions have not been achieved. Thus, an etching process may be adapted in an attempt to achieve the desired critical dimension. Then, at a second point in time T11, a signature S11 may be generated that indicates that although the desired critical dimensions have still not been achieved, that progress toward the desired critical dimension has occurred. Thus, the etching process may be continued until a later point in time T112, when a signature S12 indicates that the desired critical dimensions have been achieved. However, the signature S11 may have indicated that the adaptation to the etching process produced a movement away from desired critical dimensions, and thus all or portions of the wafer 320 may need to be scrapped or further adaptations of the etch process may be attempted.

Figure 4:
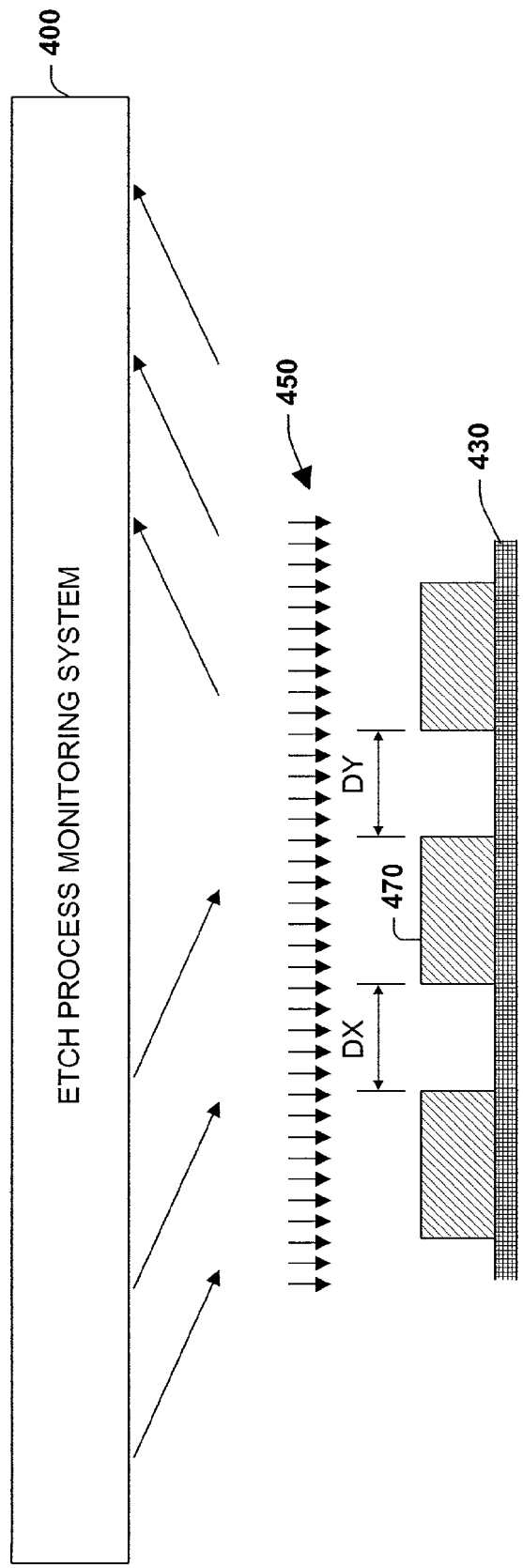
FIG. 4 is a cross-sectional view of a wafer being etched and monitored in accordance with an aspect of the present invention.

Thus, turning to FIG. 4, an etch process monitoring system 400 is illustrated monitoring an etch process 450 being applied to a wafer 430, whereupon one or more features 470 are being etched. While features 470 are illustrated, it is to be appreciated that gratings may also be analyzed in accordance with the present invention. It is to be appreciated that the etch process 450 may be performed by etching components associated with etch steps performed before a main etch (e.g., descum etch), PR trim etch steps, BARC (breakthrough anti-reflective coating) etch steps and main etch steps. The etch process 450 can be monitored by the etch process monitoring system 400 until, for example, signatures indicating that desired widths DX and DY are achieved. At such time, the etch process 450 can be terminated, and subsequent processing can proceed. Retrieving in-situ information concerning direct measurements of the widths DX and DY, and/or similar information from one or more gratings, and producing real-time feed-forward information that can be employed to adapt the etch process 450, and/or other etch processes, facilitates achieving more precise CDs and thus provides advantages over conventional systems. By way of illustration, conventional laser reflectance monitoring methods do not provide in situ etch rate information. By way of further illustration, in laser interferometry methods, the laser must be focused on an open flat region, thus prime wafer real estate is sacrificed for the testing area. Also, such laser interferometry methods may only provide information on a limited area of the wafer surface.

Figure 5:
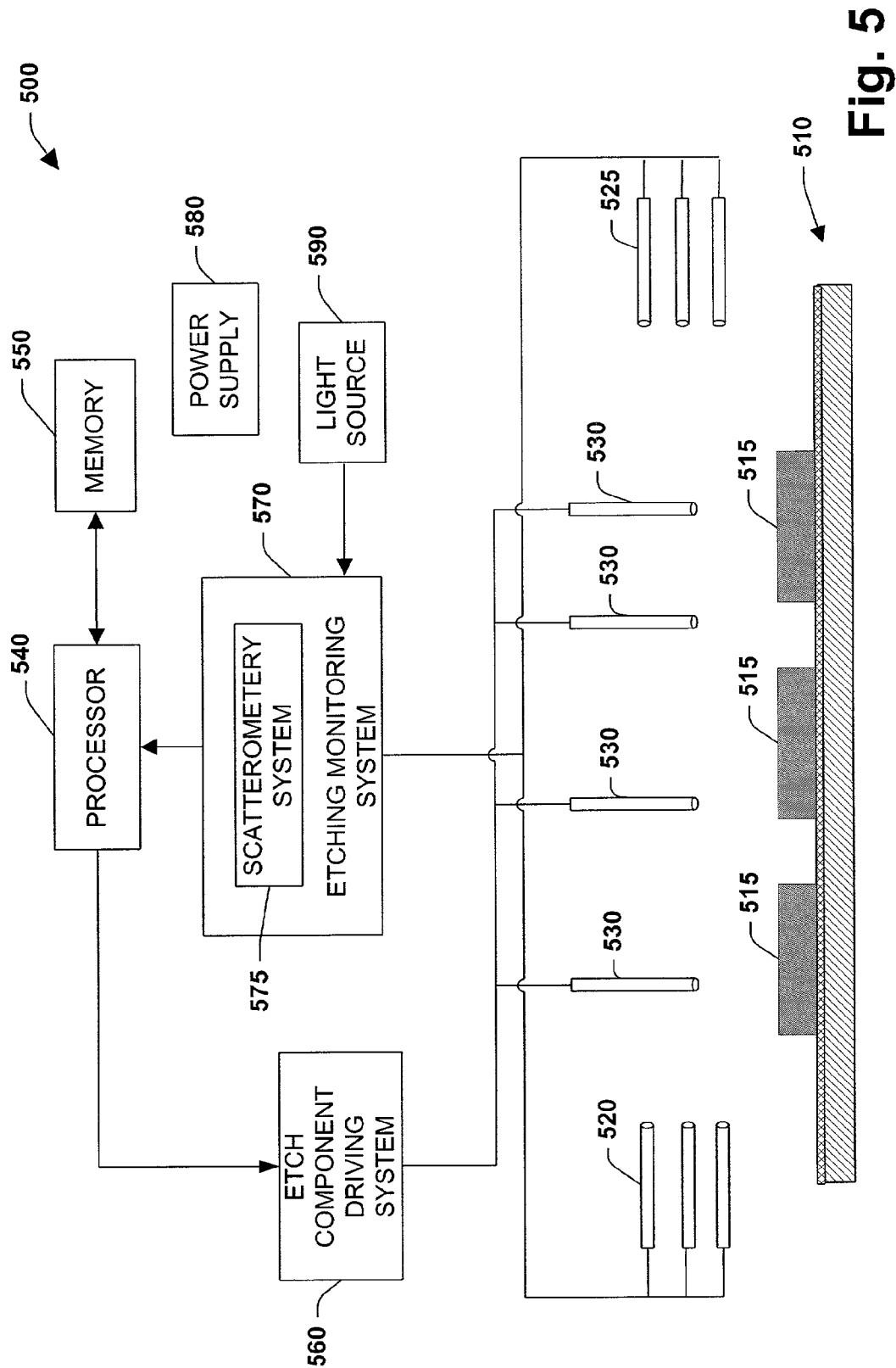
FIG. 5 is schematic block diagram of an etching process CD monitoring and controlling system in accordance with an aspect of the present invention.

FIG. 5 illustrates a system 500 for monitoring and controlling etch processes. The system 500 operates to control one or more etch components 530 in order to optimize etch processes and to mitigate fabricating poorly etched features and wafers. An etching monitoring system 570, a processor 540 and an etch component driving system 560 work cooperatively to control the etch components 530.

The etch components 530 are coupled to and controlled directly by the etch component driving system 560. The etch component driving system 560 receives information and/or instructional commands from the processor 540. The processor 540 determines the content and type of information transmitted to the etch component driving system 560 according to its analysis of data received from and collected by the monitoring system 570. Thus, through the interaction of components 530, 570, 540 and 560, the system 500 has the ability to improve subsequent etch processes for the same wafer and/or for subsequent wafers. In addition, by communicating measurements relating to recently etched features/wafers to the processor 540, the processor 540 can control the etching component driving system 560, which can thus regulate the one or more etching components 530 to facilitate obtaining more precise and improved etching processes. Thus etching errors can be mitigated and higher packing densities and smaller feature sizes can be achieved.

The system 500 includes one or more etching components 530 that are selectively controlled to facilitate controlled etching of the wafer 510. One or more target light sources 520 project light onto respective portions of the wafer 510. A portion of the wafer 510 may have one or more gratings 515 and/or features located on that portion. Light reflected and/or refracted by the one or more gratings 515 is collected by one or more light detecting components 525, and processed by an etching monitoring system 570 to measure at least one parameter relating to the etching of one or more features and/or the one or more gratings 515. For example, spaces between portions of the grating 515 and spaces between the gratings 515 can be measured and compared to desired critical dimensions (CDs). The reflected light is measured with respect to the incident light in order to obtain the various parameters relating to the gratings 515.

The monitoring system 570 includes a scatterometry system 575. It is to be appreciated that any suitable scatterometry system may be employed to carry out the present invention, and such systems are intended to fall within the scope of the claims appended hereto.

A light source 590 (e.g., a laser) provides light to the one or more target light sources 520 via the monitoring system 570. Preferably, the light source 590 is a frequency-stabilized laser, however, it will be appreciated that any laser or other light source (e.g., laser diode or helium neon (HeNe) gas laser) suitable for carrying out the present invention may be employed. One or more light detecting components 525 (e.g., photo detector, photo diodes) collect light reflecting from, or passing through the one or more gratings 515 and/or the one or more features being etched. The monitoring system 570 may also process the measured light data into a data form compatible with or understandable to the processor 540.

The processor 540 is operatively coupled to the monitoring system 570 and receives the measured etching parameter data from the monitoring system 570. The processor 540 determines the acceptability and/or progress of the etching of the respective portions of the wafer 510 by examining measured CDs and comparing such measured CD values to stored acceptable and unacceptable CD values. The CD values may be associated with one or more signatures stored, for example, in a memory 550. In determining the acceptability and/or progress of an on-going and/or recently completed etch process, the processor 540 may also determine to what extent, if any, adjustments to the etching components 530 are necessary to optimize subsequent etch processes. Upon making the determination, the processor 540 transmits this information to the etch component driving system 560, which then makes one or more adjustments to the etching components 530.

As described above, the processor 540 is also coupled to the etching component driving system 560 that directs and controls the one or more etching components 530. The etching component driving system 560 is controlled, at least in part, by the processor 540 to selectively vary the operation of the respective etching components 530. Each respective portion of the wafer 510 is associated with a corresponding etching component 530. The processor 540 monitors the etching of one or more features and/or one or more gratings 515, and selectively regulates the etching of each portion via the corresponding etching components 530. The transmission and relay of information between the monitoring system 570, the processor 540, the etch component driving system 560 and the etch components 530 creates effective feed back control that facilitates improving IC quality by producing more precisely etched features.

The processor 540, or central processing unit, may be any of a plurality of processors, such as the AMD K7, the AMD Athlon and other similar and compatible processors. The processor 540 is programmed to control and operate the various components within the system 500 in order to carry out the various functions described herein. The manner in which the processor 540 is programmed to carry out the functions relating to the present invention will be apparent to those having ordinary skill in the art based on the description provided herein.

A memory 550, which is operatively coupled to the processor 540, is also included in the system 500 and serves to store, among other things, program code executed by the processor 540 for carrying out operating functions of the system 500 as described herein. For example, the memory 550 can hold patterns to which observed data can be compared. The memory 550 also serves as a storage medium for temporarily storing etching parameter data such as etching progress values, etching progress tables, component coordinate tables, grating sizes, grating shapes, scatterometry information, achieved CDs, desired CDs and other data that may be employed in carrying out the present invention.

A power supply 580 provides operating power to the system 500. Any suitable power supply (e.g., battery, line power) may be employed to carry out the present invention.

Turning now to FIG. 6, one aspect of the present invention is shown. FIG. 6 illustrates the system 500 being employed to measure the etching of a particular portion of the wafer 510. The target light source 520 directs a light 630 incident to the surface of the wafer 510. The angle of a reflected light 640 from the surface of the wafer 510 will vary in accordance with the evolving dimensions of the grating 515, and/or with the evolving dimensions of one or more features being etched in the wafer 510. The one or more light detecting components 525 collect the reflected light 640 and transmit the collected light, and/or data associated with the collected light, to the monitoring system 570. The monitoring system 570 collects the reflected light 640, and/or related data, in accordance with scatterometry techniques. The monitoring system 570 then provides the processor 540 with the data corresponding to the etching characteristics associated with the wafer 510. The data may include, for example, information relating to the dimensions of etched areas relative to, or independent of, dimensions of unetched areas, and/or surface characteristics as well as other measurements relating to the etch process.

In another aspect of the invention, the data may also include conclusory information including, but not limited to, whether desired dimensions have been reached and whether etching should continue, whether desired CDs have been reached and thus whether adjustments are required and whether measured etch dimensions are within a predetermined range.

The monitoring system 570 provides direct, real-time measurements to the processor 540, as opposed to measurements taken according to pre-determined system schedules and measurements taken post-fabrication. Providing direct, real-time feedback to the processor 540 facilitates selective control of etch processes and improved etching precision over conventional methods and/or apparatus.

Turning now to FIGS. 7–9, another aspect of the present invention is shown. In addition to the methods described above, a wafer 710 may be logically partitioned into grid blocks to facilitate determining positions or locations where the wafer 710 may benefit from adjusting one or more etch processes. Obtaining such positions or locations may facilitate determining to what extent, if any, etch process parameter adjustments are necessary. Obtaining such information may also assist in determining problem areas associated with etch processes.

FIG. 7 illustrates a perspective view of a chuck 730 supporting the wafer 710, whereupon one or more gratings may be formed. The wafer 710 may be divided into a grid pattern as shown in FIG. 8. Each grid block (XY) of the grid pattern corresponds to a particular portion of the wafer 710, and each grid block is associated with one or more gratings and/or one or more portions of one or more gratings. The grid blocks are individually monitored for etch process parameters and etching may be individually controlled for each grid block. It is to be appreciated that the size and/or shape of gratings can be manipulated to facilitate analyzing different critical dimensions. For example, for a particular layer in an integrated circuit, a CD relating to a width between features may be important. Thus, the gratings can be patterned to optimize analyzing the width between features.

In FIG. 9, one or more gratings in the respective portions of the wafer 710 ($X_1Y_1 \ldots X_{12}, Y_{12}$) are monitored for CDs produced during the etch process using reflected light, the monitoring system 570 (FIG. 5) and the processor 540 (FIG. 5). Exemplary CD measurements produced during etching for each grating are shown. As can be seen, the CD measurement at coordinate $X_7Y_6$ is substantially higher than the CD measurement of the other portions XY. It is to be appreciated that the wafer 710 may be mapped into any suitable number of grid blocks, and any suitable number of gratings may formed on the wafer 710. Although the present invention is described with respect to one etching component 530 corresponding to one grid block XY, it is to be appreciated that any suitable number of etching components 530 corresponding to any suitable number of wafer portions/grid blocks may be employed.

FIG. 9 is a representative table of CD measurements taken for the various grid blocks that have been correlated with acceptable CD values for the portions of the wafer 710 mapped by the respective grid blocks. As can be seen, all the grid blocks, except grid block $X_7Y_6$, have CD measurements corresponding to an acceptable CD table value ($T_A$) (e.g., are within an expected range of etching measurements), while grid block $X_7Y_6$ has an undesired CD table value ($T_U$). Thus, the processor 540 has determined that an undesirable etching condition exists at the portion of the wafer 710 mapped by grid block $X_7Y_6$. Accordingly, the processor 540 can drive at least an etching component 530$_{7,6}$, which corresponds to the portion of the wafer 710 mapped at grid block $X_7Y_6$, to attempt to produce an acceptable CD. It is to be appreciated that the etching components 530 may be driven so as to maintain, increase, and/or decrease, the rate of etching of the respective portions of the wafer 710 as desired. When the processor 540 determines that the etching process has reached a predetermined threshold level, the processor 540 may terminate the etching by one or more etching components 530, thus enabling more precise control of the etching process, which provides advantages over conventional systems.

Figure 10:
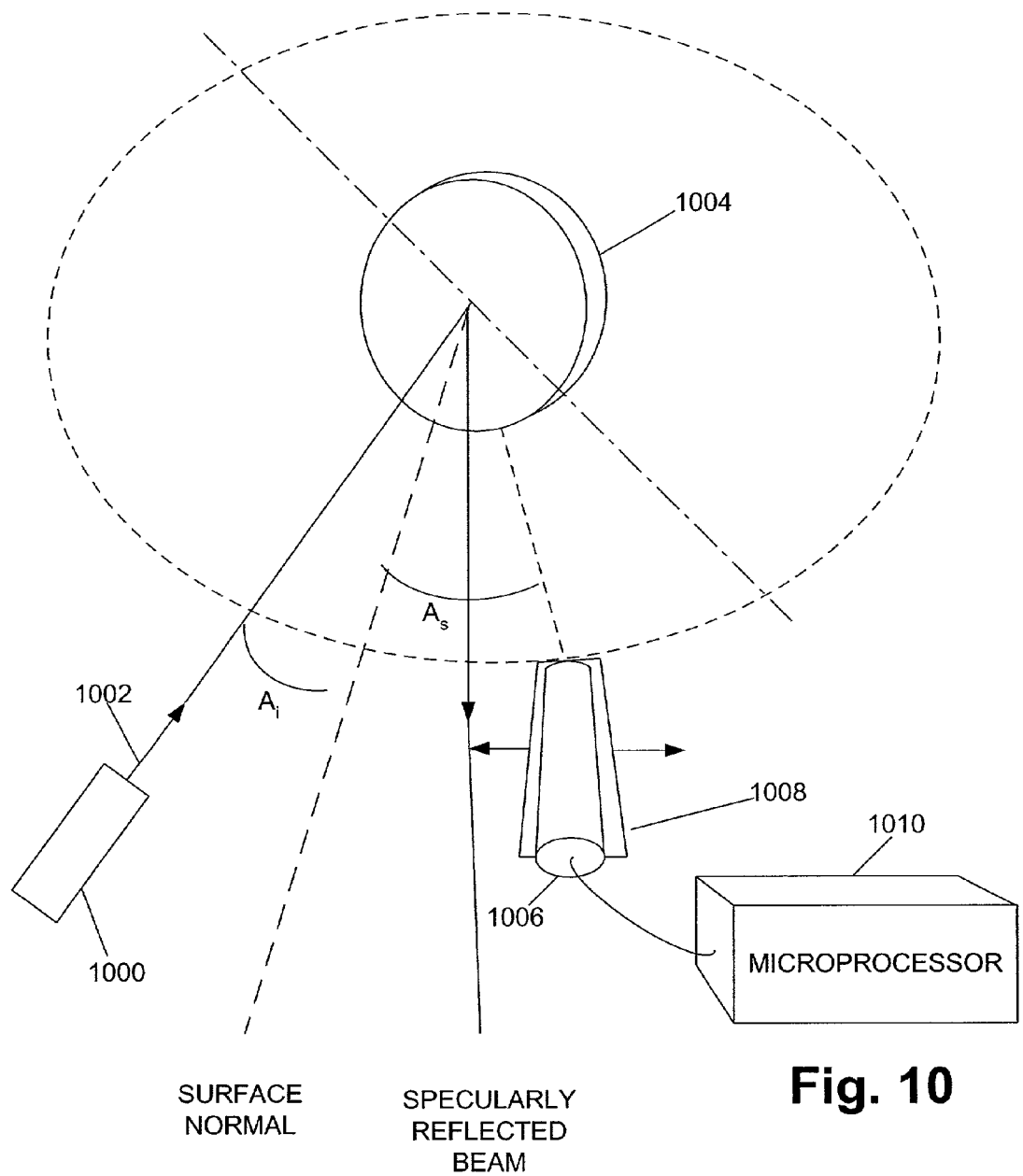
FIG. 10 illustrates an exemplary scatterometry system collecting reflected light.

FIG. 10 illustrates an exemplary scatterometry system collecting reflected light. Light from a laser 1000 is brought to focus in any suitable well-known manner to form a beam 1002. A sample, such as a wafer 1004, is placed in the path of the beam 1002 and a photo detector or photo multiplier 1006 of any suitable well-known construction. Different detector methods may be employed to determine the scattered power. To obtain a grating pitch, the photo detector or photo multiplier 1006 may be mounted on a rotation stage 1008 of any suitable well-known design. A microprocessor 1010, of any suitable well-known design, may be used to process detector readouts, including, but not limited to, angular locations of different diffracted orders leading to diffraction grating pitches being calculated. Thus, light reflected from the sample 1004 may be accurately measured.

Figure 11:
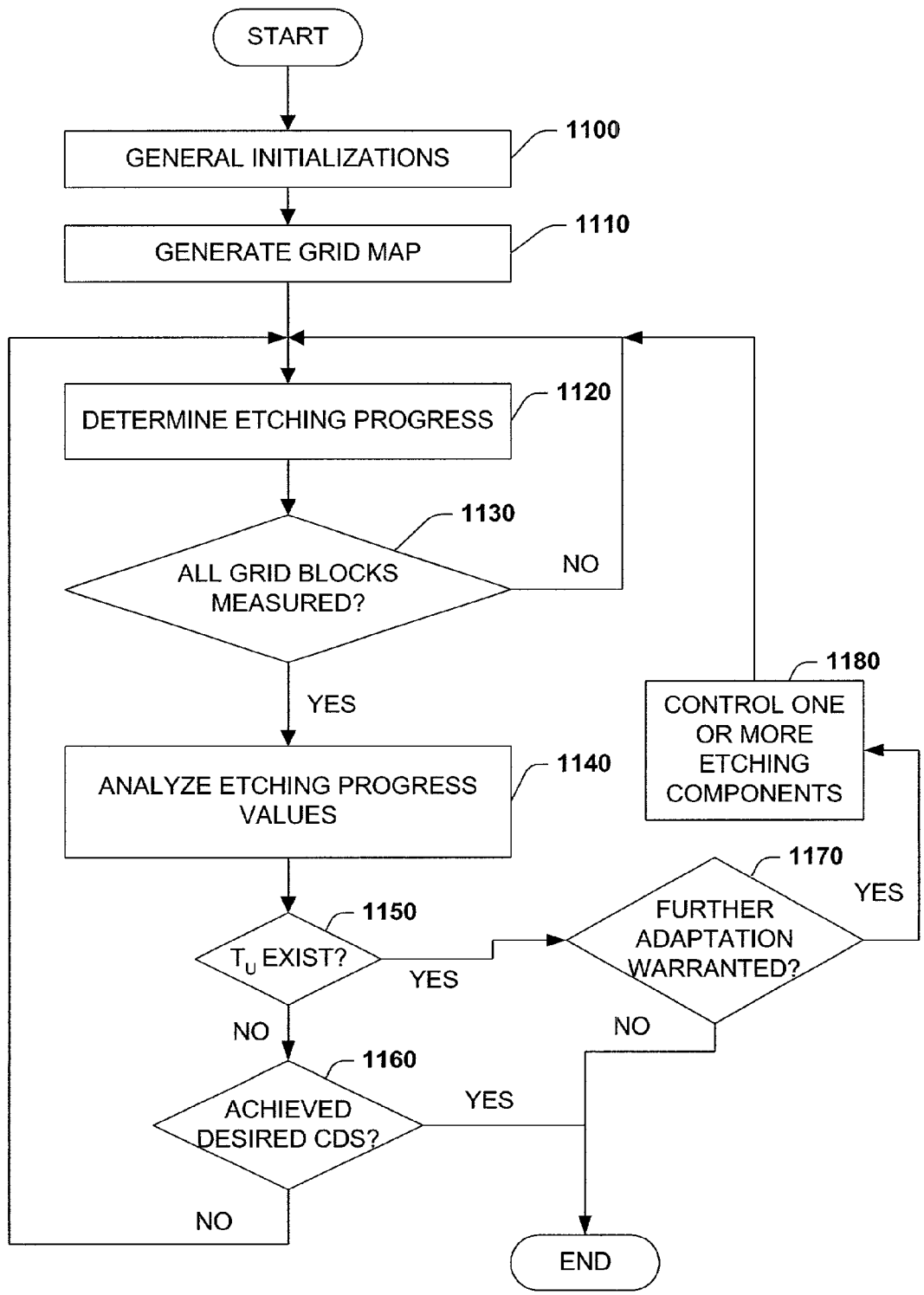
FIG. 11 is a flow diagram illustrating one specific methodology for carrying out the present invention.

In view of the exemplary systems shown and described above, methodologies that may be implemented in accordance with the present invention will be better appreciated with reference to the flow diagram of FIG. 11. While for purposes of simplicity of explanation, the methodology of FIG. 11 is shown and described as a series of blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement a methodology in accordance with the present invention.

FIG. 11 is a flow diagram illustrating one particular methodology for carrying out the present invention. At 1100, general initializations are performed. Such initializations can include, but are not limited to, establishing pointers, allocating memory, setting variables and establishing communication channels. At 1110, a grid map of a plurality of grid blocks "XY" is created. At 1120, etching determinations are made with respect to the various wafer portions mapped by the respective grid blocks XY. At 1130, a determination is made concerning whether all grid block measurements have been taken. If the determination at 1130 is NO, then processing returns to 1120. If the determination at 1130 is YES, then at 1140, determined dimension values are analyzed and compared against acceptable CDs for the respective portions of a wafer. In an alternative example of the present invention, the determination at 1130 may concern whether a sufficient number of grid blocks have been measured to facilitate valid CD analysis.

At 1150, a determination is made concerning whether etching values are not acceptable. If etching values are acceptable, then processing continues at 1160 where a determination is made concerning whether desired CDs have been achieved. If desired CDs have been achieved, then processing can conclude. Otherwise, processing continues at 1120. If unacceptable dimension values are found at 1150, processing proceeds to 1170 where a determination is made concerning whether further adaptation is warranted. By way of illustration, the unacceptable dimension values may indicate that portions of the wafer and/or the entire wafer being processed have been damaged to such an extent that further adaptations to the etch process are unwarranted. Such a damaged portion and/or wafer may be marked for discard. By way of further illustration, analysis of the unacceptable dimensions may indicate that a simple adaptation is appropriate. After the analyses, relevant etching components corresponding to grid blocks with unacceptable etching values are controlled to regulate the etching of the respective wafer portions to facilitate achieving desired dimensions. The present iteration is then ended and the process returns to 1120 to perform another iteration.

Turning now to FIGS. 12–17, the concept of scatterometry and how it is employed in the present invention is discussed. Scatterometry is a technique for extracting information about a surface upon which an incident light has been directed. Scatterometry is a metrology that relates the geometry of a sample to its scattering effects. Scatterometry is based on the reconstruction of the grating profile from its optical diffraction responses. Information concerning properties including, but not limited to, dishing, erosion, profile, thickness of thin films and critical dimensions of features present on the surface can be extracted. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed. Such properties include, but are not limited to, the chemical properties of the surface, the planarity of the surface, features on the surface, voids in the surface, and the number and/or type of layers beneath the surface. In the present invention, the intensity and/or phase of the reflected and/or diffracted light will be examined as it relates to critical dimensions desired on the wafer being etched.

Different combinations of the above-mentioned properties will have different effects on the phase and/or intensity of the incident light resulting in substantially unique intensity/phase signatures in the complex reflected and/or diffracted light. Thus, by examining a signal (signature or stored value) library of intensity/phase signatures, a determination can be made concerning the properties of the surface. Such substantially unique phase/intensity signatures are produced by light reflected from and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N = n - jk, \text{ where j is an imaginary number.}$$

The signal (signature) library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer can generate a second phase/intensity signature. For example, a line of a first width may generate a first signature while a line of a second width may generate a second signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing over three hundred thousand phase/intensity signatures. Thus, when the phase/intensity signals are received front scatterometry detecting components, the phase/intensity signals can be pattern matched, for example, to the library of signals to determine whether the signals correspond to a stored signature.

Figure 12:
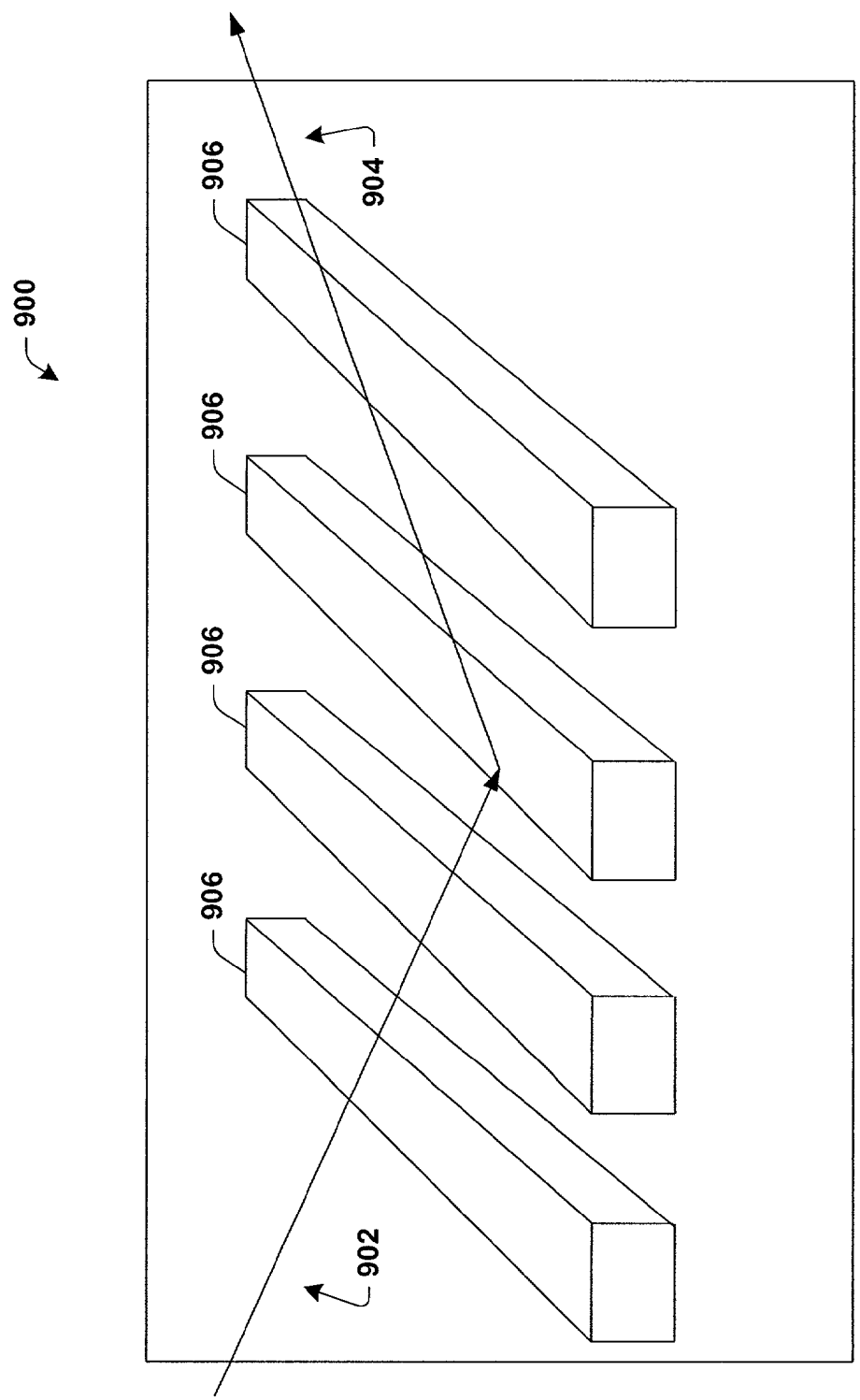
FIG. 12 is a simplified perspective view of an incident light reflecting off a surface, in accordance with an aspect of the present invention.

To illustrate the principles described above, reference is now made to FIGS. 12 through 17. Referring initially to FIG. 12, an incident light 902 is directed at a surface 900, upon which one or more features 906 may exist. The incident light 902 is reflected as reflected light 904. The properties of the surface 900, including but not limited to, thickness, uniformity, planarity, chemical composition and the presence of features, can affect the reflected light 904. The features 906 are raised upon the surface 900. The phase and intensity of the reflected light 904 can be measured and plotted, as shown, for example, in FIG. 17. The phase 960 of the reflected light 904 can be plotted, as can the intensity 962 of the reflected light 904. Such plots can be employed to compare measured signals with signatures stored in a signature library using techniques like pattern matching, for example.

Figure 13:
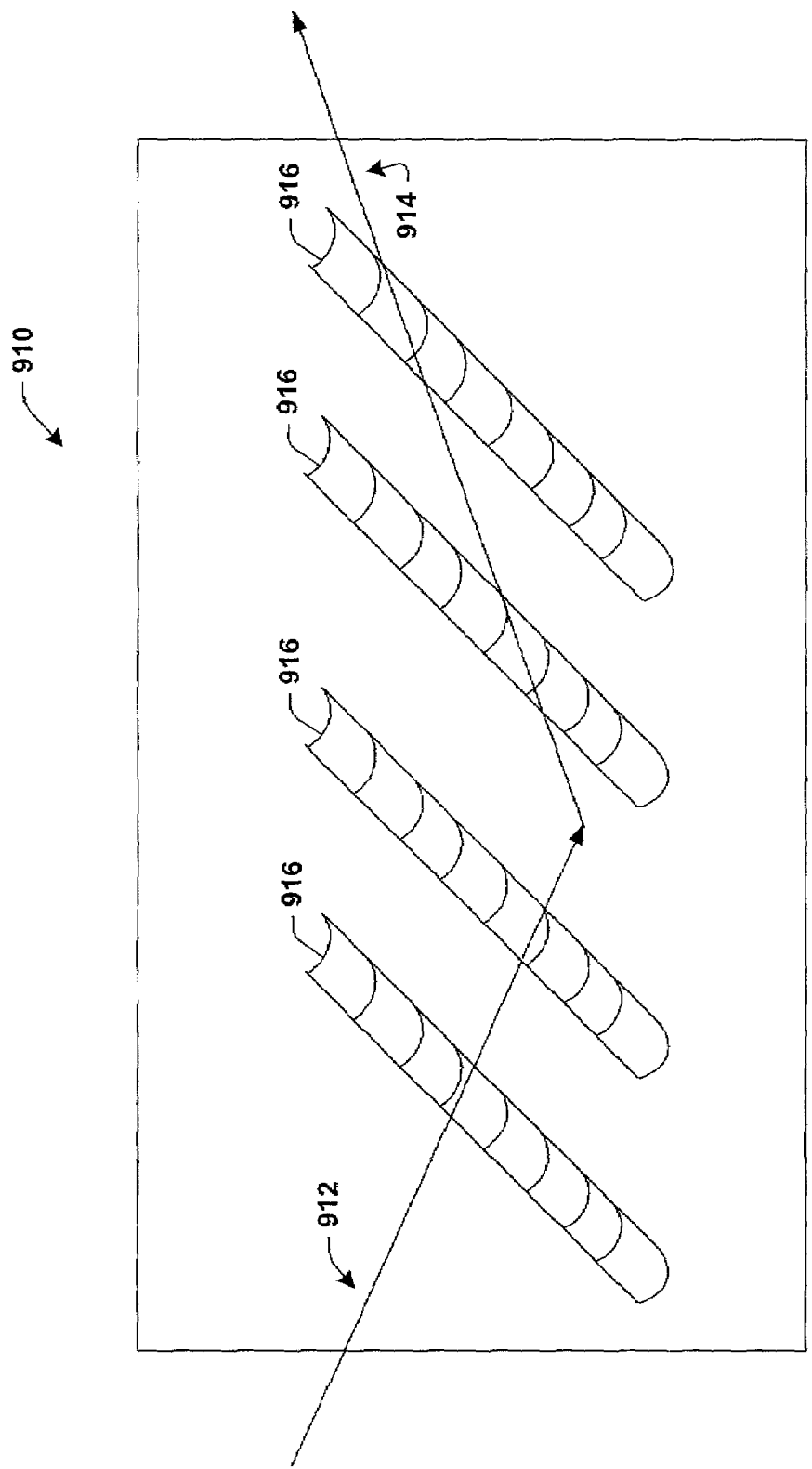
FIG. 13 is a simplified perspective view of an incident light reflecting off a surface, in accordance with an aspect of the present invention.

Referring now to FIG. 13, an incident light 912 is directed onto a surface 910 upon which one or more depressions 916 appear. The incident light 912 is reflected as reflected light 914. Like the one or more features 906 (FIG. 12) may affect an incident beam, so too may the one or more depressions 916 affect an incident beam. Thus, it is to be appreciated by one skilled in the art that scatterometry can be employed to measure features appearing on a surface, features appearing in a surface, and properties of a surface itself, regardless of features.

Figure 14:
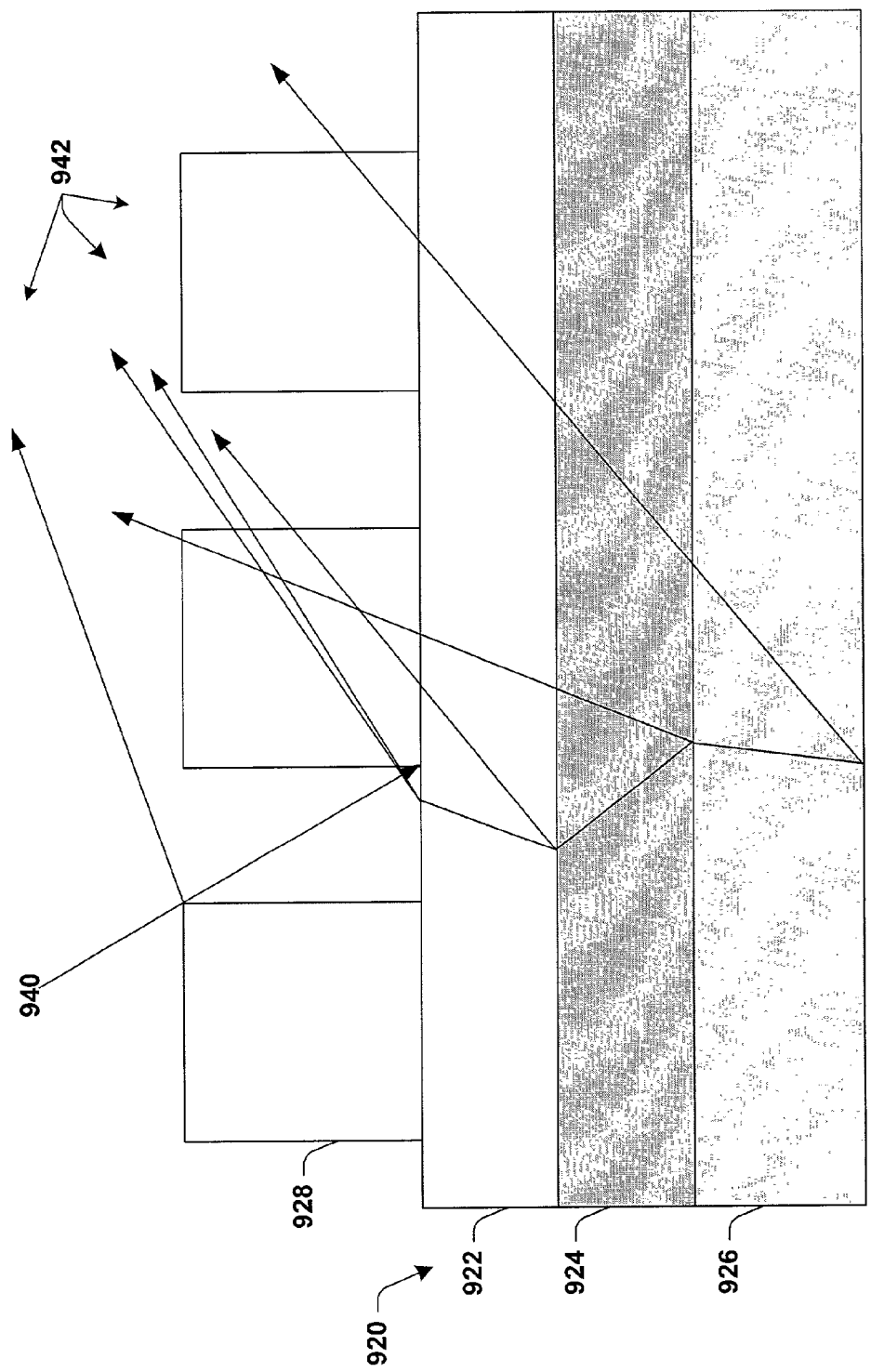
FIG. 14 illustrates a complex reflected and refracted light produced when an incident light is directed onto a surface, in accordance with an aspect of the present invention.

Turning now to FIG. 14, complex reflections and refractions of an incident light 940 are illustrated. The reflection and refraction of the incident light 940 can be affected by factors including, but not limited to, the presence of one or more features 928, and the composition of the substrate 920 upon which the features 928 reside. For example, properties of the substrate 920 including, but not limited to the thickness of a layer 922, the chemical properties of the layer 922, the opacity and/or reflectivity of the layer 922, the thickness of a layer 924, the chemical properties of the layer 924, the opacity and/or reflectivity of the layer 924, the thickness of a layer 926, the chemical properties of the layer 926, and the opacity and/or reflectivity of the layer 926 can affect the reflection and/or refraction of the incident light 940. Thus, a complex reflected and/or refracted light 942 may result from the incident light 940 interacting with the features 928, and/or the layers 922, 924 and 926. Although three layers 922, 924 and 926 are illustrated in FIG. 14, it is to be appreciated by one skilled in the art that a substrate can be formed of a greater or lesser number of such layers.

Figure 15:
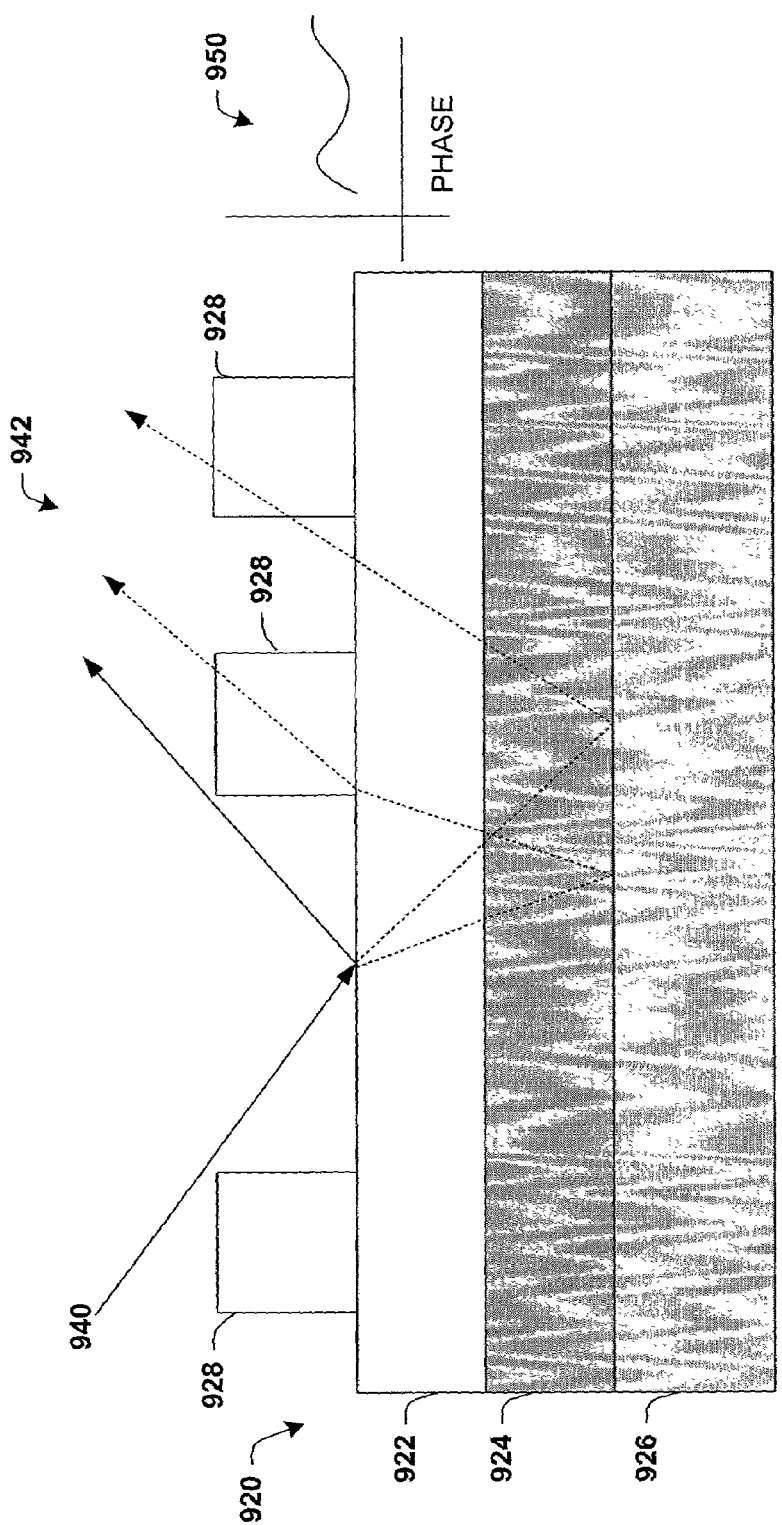
FIG. 15 illustrates a complex reflected and refracted light produced when an incident light is directed onto a surface, in accordance with an aspect of the present invention.
Figure 16:
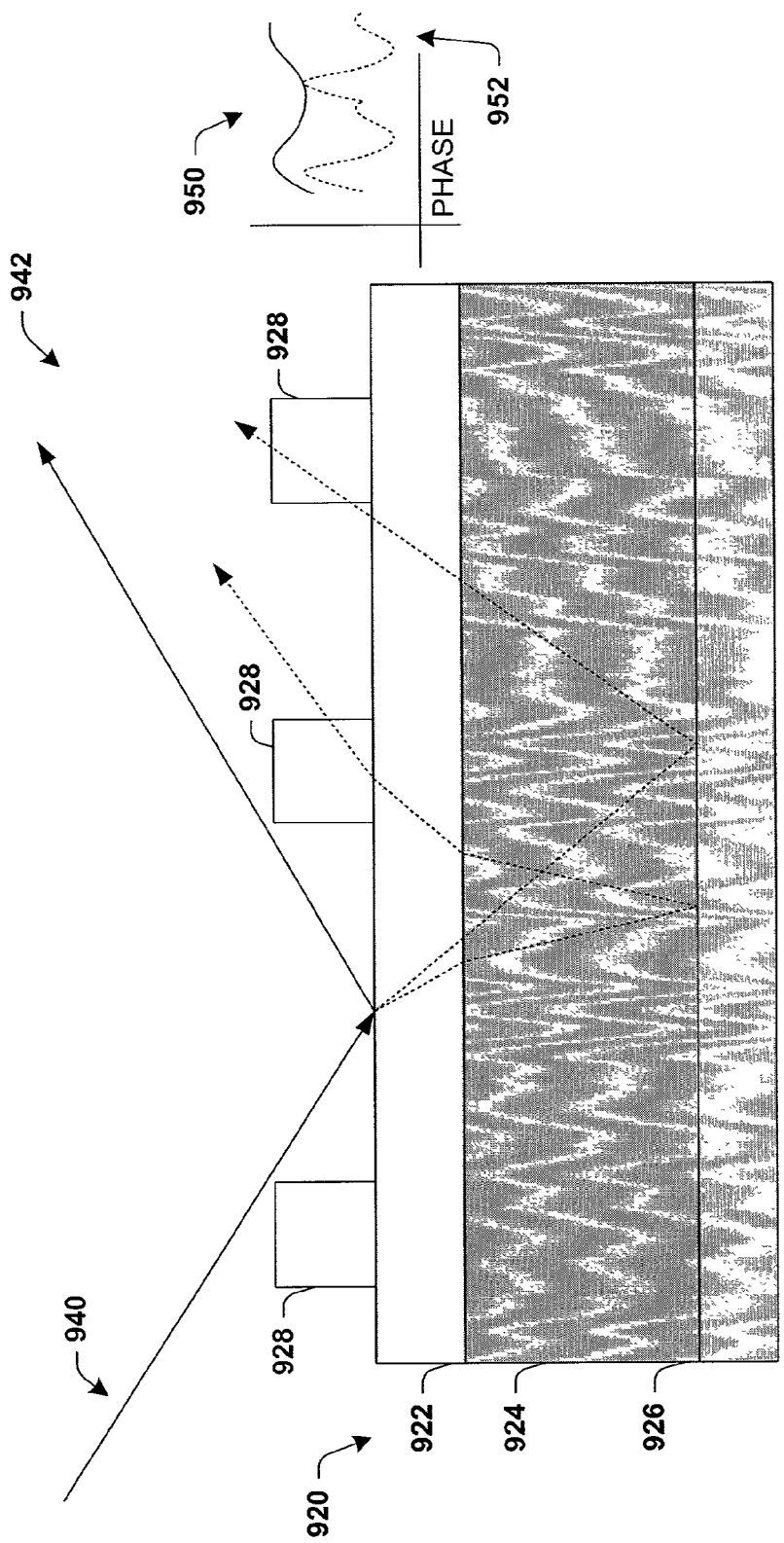
FIG. 16 illustrates a complex reflected and refracted light produced when an incident light is directed onto a surface, in accordance with an aspect of the present invention.
Figure 17:
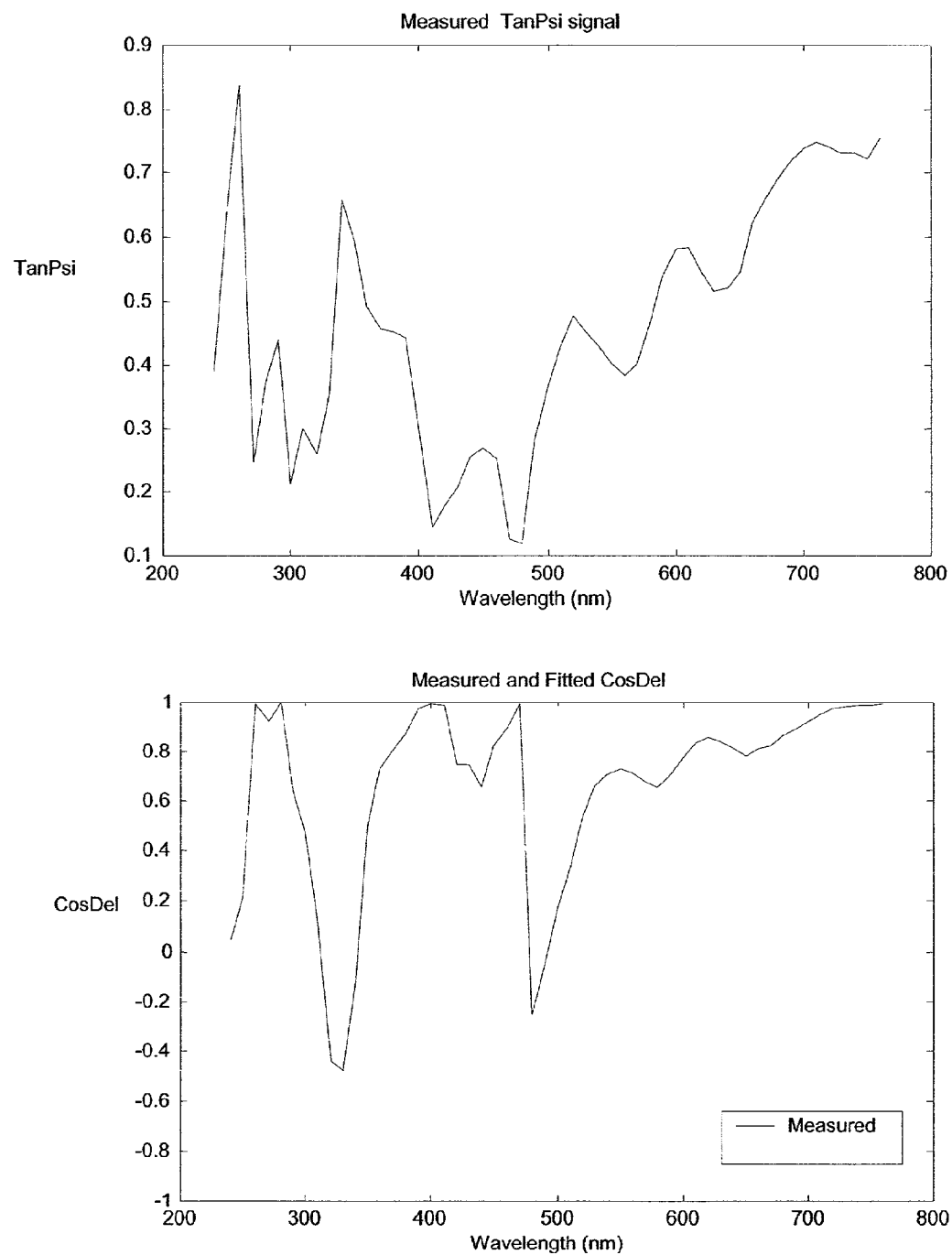
FIG. 17 illustrates phase and intensity signals recorded from a complex reflected and refracted light produced when an incident light is directed onto a surface, in accordance with an aspect of the present invention.

Turning now to FIG. 15, one of the properties from FIG. 14 is illustrated in greater detail. The substrate 920 can be formed of one or more layers 922, 924 and 926.

The phase 950 of the reflected and/or refracted light 942 can depend, at least in part, on the thickness of a layer, for example, the layer 924. Thus, in FIG. 16, the phase 952 of the reflected light 942 differs from the phase 950 due, at least in part, to the different thickness of the layer 924 in FIG. 16.

Thus, scatterometry is a technique that can be employed to extract information about a surface upon which an incident light has been directed. The information can be extracted by analyzing phase and/or intensity signals of a complex reflected and/or diffracted light. The intensity and/or the phase of the reflected and/or diffracted light will change based on properties of the surface upon which the light is directed, resulting in substantially unique signatures that can be analyzed to determine one or more properties of the surface upon which the incident light was directed.

Using scatterometry in the present invention facilitates a relatively noninvasive approach to detecting etch process errors and to mitigating those errors in subsequent etch processes.

Described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for monitoring and regulating an etch process, comprising:
   at least one etching component that etches at least one portion of a wafer;
   an etch component driving system that drives the at least one etching component;
   a system that directs light onto one or more gratings located on at least one portion of the wafer;
   an etch monitoring system that measures one or more etching parameters from light reflected from the one or more gratings; and
   a processor operatively coupled to the etch monitoring system and the etch component driving system, the processor receives etching parameter data from the measuring system and analyzes the etching parameter data by comparing the etching parameter data to stored etching data to generate a feed-forward control data operative to control the at least one etching component, the processor further logically maps the wafer into one or more grid blocks and makes a determination of acceptability of etching values in the one or more grid blocks.

2. The system of claim 1, the one or more etching parameters relate to at least one of size of a feature on the wafer, shape of a feature on the wafer, location of a feature on the wafer, a chemical property of a wafer, site of gratings, shape of gratings, location of gratings, size of space between features, shape of space between features, and location of space between features.

3. The system of claim 1, the processor determines the existence of unacceptable etching values for at least a portion of the wafer based on comparing one or more measured etching values to one or more stored etching values.

4. The system of claim 3, the processor employs a non-linear training system in computing feed-forward control data operable to adjust the at least one etching component.

5. The system of claim 1, the etch monitoring system further comprises a scatterometry system that processes the light reflected from the one or more gratings.

6. The system of claim 5 the processor is operatively coupled to the scatterometry system, the processor analyzes data received from the scatterometry system and produces analyzed data, the processor controls, at least in part, the at least one etching component via the etching component driving system based, at least in part, on the analyzed data.

7. The system of claim 6, the etch process is at least one of descum etching, photoresist trim etching, breakthrough anti-reflective coating etching and main etching.

8. The system of claim 6, the etch process is at least one of an isotropic etch process and an anisotropic etch process.

9. The system of claim 6, the etch process is a dry-etching process where the mechanism of etching has at least one of a physical basis, a chemical basis and a combination of physical and chemical bases.

10. The system of claim 9, the dry-etching technique with a mechanism of etching as a physical basis is at least one of a glow-discharge sputtering technique and an ion-milling technique.

11. The system of claim 9, the dry-etching technique with a mechanism of etching as a chemical basis is a plasma etching technique.

12. The system of claim 11, the dry-etching technique with a combination of bases is at least one of a reactive ion etching (RIE) technique and an ion-enhanced etching technique.

* * * * *